United States Patent
Meisel et al.

(10) Patent No.: US 8,048,814 B2
(45) Date of Patent: Nov. 1, 2011

(54) METHODS AND APPARATUS FOR ALIGNING A SET OF PATTERNS ON A SILICON SUBSTRATE

(75) Inventors: Andreas Meisel, Mountain View, CA (US); Michael Burrows, Cupertino, CA (US); Homer Antoniadis, Mountain View, CA (US)

(73) Assignee: Innovalight, Inc., Sunnyvale, CA (US)

( * ) Notice: Subject to any disclaimer, the term of this patent is extended or adjusted under 35 U.S.C. 154(b) by 44 days.

(21) Appl. No.: 12/468,540

(22) Filed: May 19, 2009

(65) Prior Publication Data

US 2010/0136718 A1    Jun. 3, 2010

(51) Int. Cl.
*H01L 21/47* (2006.01)
(52) U.S. Cl. .................. 438/781; 257/E21.242
(58) Field of Classification Search .................. 438/781; 257/E21.242
See application file for complete search history.

(56) References Cited

U.S. PATENT DOCUMENTS

2005/0231855 A1   10/2005   Tran
2007/0082487 A1    4/2007   Chiang et al.

FOREIGN PATENT DOCUMENTS

WO    WO 2008/131313 A2    10/2008
WO    WO 2008131313  A2 *  10/2008

OTHER PUBLICATIONS

Pedraza, "Suface Nanostructuring of Silicon," Appl. Phys. A., 77, 277-284 (2003).*
Iijima, S., "Fine Particles of Silicon. I. Crystal Growth of Spherical Particles of Si," Japanese Journal of Applied Physics, vol. 26, No. 3, Mar. 1987, pp. 357-364.
Littau, K. A. et al., "A Luminescent Silicon Nanocrystal Colloid via a High-Temperature Aerosol Reaction," J. Phys. Chem., vol. 97, No. 6, 1993, pp. 1224-1230.
Jasinski, J. M. et al., "Photochemical Preparation of Crystalline Silicon Nanoclusters," Chem. Mater., vol. 3, No. 6, 1991, pp. 989-992.
Petrova-Koch, V. et al., "Rapid-thermal-oxidized porous Si—The superior photoluminescent Si," Appl. Phys. Lett., vol. 61, No. 8, Aug. 24, 1992, pp. 943-945.
Takagi, H. et al., "Quantum size effects on photoluminescence in ultrafine Si particles," Appl. Phys. Lett., vol. 56, No. 24, Jun. 11, 1990, pp. 2379-2380.

(Continued)

*Primary Examiner* — Steven Fulk
(74) *Attorney, Agent, or Firm* — Foley & Lardner LLP

(57) ABSTRACT

A method of aligning a set of patterns on a substrate, the substrate including a substrate surface, is disclosed. The method includes depositing a set of silicon nanoparticles on the substrate surface, the set of nanoparticles including a set of ligand molecules including a set of carbon atoms, wherein a first set of regions is formed where the silicon nanoparticles are deposited and the remaining portions of the substrate surface define a second set of regions. The method also includes densifying the set of silicon nanoparticles into a thin film wherein a set of silicon-organic zones are formed on the substrate surface, wherein the first set of regions has a first reflectivity value and the second set of regions has a second reflectivity value. The method further includes illuminating the substrate surface with an illumination source, wherein the ratio of the second reflectivity value to the first reflectivity value is greater than about 1.1.

17 Claims, 12 Drawing Sheets

OTHER PUBLICATIONS

Heath, James R., "A Liquid-Solution-Phase Synthesis of Crystalline Silicon," Science, vol. 258, Nov. 13, 1992, pp. 1131-1133.

International Search Report and Written Opinion mailed Jul. 16, 2010, in corresponding PCT/US2010/035231, 8 pages.

Fowlkes et al., "Surface microstructuring and long-range ordering of silicon nanoparticles," Applied Physics Letters, May 20, 2002, 80(20):3799-3801.

Pedraza et al., "Surface nanostructuring of silicon," Appl. Phys. A., 2003, 77:277-284.

Peng et al., "Uniform, Axial-Orientation Alighnment of One-Dimensional Single-Crystal Silicon Nanostructure Arrays," Angew. Chem. Intl. Ed., May 6, 2006, 44(18):2737-2742.

Cohen et al., "Gray-scale Image Segmentation Using a Parallel Graph-Theoretic Algorithm," Australian Pattern Recognition Society, Segment '96, Sydney, Dec. 13, 1996.

"A Guide to Anti-Reflective Coatings—XeroCoat Anti-Reflective Coating," available at www.xerocoat.com, Accessed May 1, 2009.

Neuhaus et al., "Industrial Silicon Wafer Solar Cells," *Advances in OptoElectronics*, (2007).

Van Kerschaver et al., "Back-contact Solar Cells: A Review," *Prog. Photovolt: Res. Appl. 2006*, 14:107-123, available online at: www.interscience.wiley.com, Published Online Dec. 20, 2005.

\* cited by examiner

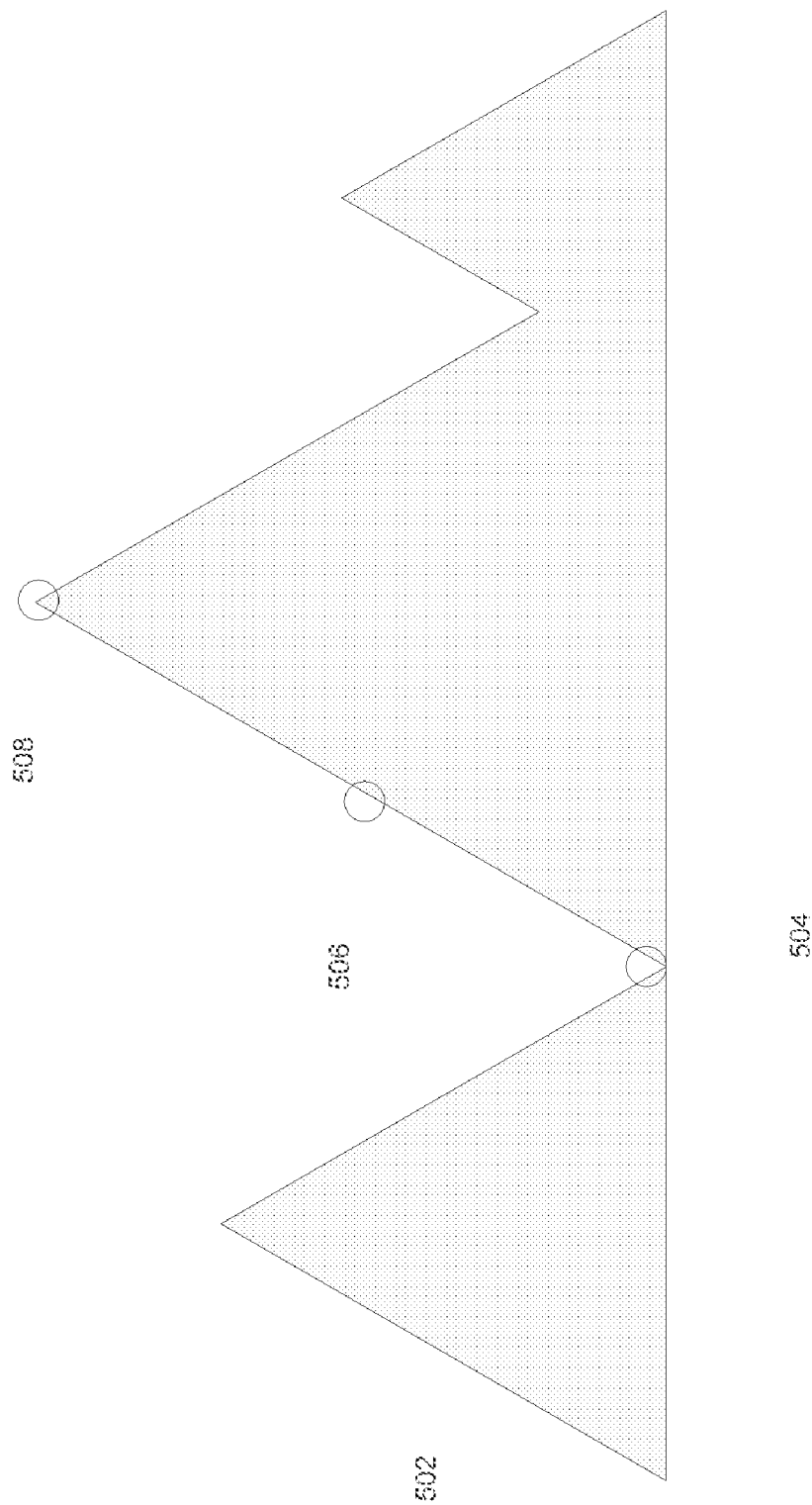

METHODS AND APPARATUS FOR ALIGNING A SET OF PATTERNS ON A SILICON SUBSTRATE

FIELD OF DISCLOSURE

This disclosure relates in general to Group IV semiconductors and in particular to methods and apparatus for aligning a set of patterns on a silicon substrate.

BACKGROUND

Semiconductors form the basis of modern electronics. Possessing physical properties that can be selectively modified and controlled between conduction and insulation, semiconductors are essential in most modern electrical devices (e.g., computers, cellular phones, photovoltaic cells, etc.). Group IV semiconductors generally refer to those first four elements in the fourth column of the periodic table: carbon, silicon, germanium and tin.

The ability to deposit semiconductor materials using non-traditional semiconductor technologies such as printing may offer a way to simplify the fabrication process and hence reduce the cost of many modern electrical devices (e.g., computers, cellular phones, photovoltaic cells, etc.). Like pigment in paint, these semiconductor materials are generally formed as microscopic particles, such as nanoparticles, and temporarily suspended in a colloidal dispersion that may be later deposited on a substrate.

Nanoparticles are generally particles with at least one dimension less than 100 nm. In comparison to a bulk material (>100 nm) which tends to have constant physical properties regardless of its size (e.g., melting temperature, boiling temperature, density, conductivity, etc.), nanoparticles may have physical properties that are size dependent, such as a lower sintering temperature.

The nanoparticles may be produced by a variety of techniques such as evaporation (S. Ijima, Jap. J Appl. Phys. 26, 357 (1987)), gas phase pyrolysis (K. A Littau, P. J. Szajowski, A. J. Muller, A. R. Kortan, L. E. Brus, J Phys. Chem. 97, 1224 (1993)), gas phase photolysis (J. M. Jasinski and F. K. LeGoues, Chem. Mater. 3, 989 (1991);), electrochemical etching (V. Petrova-Koch et al., Appl. Phys. Lett. 61, 943 (1992)), plasma decomposition of silanes and polysilanes (H. Takagi et al, Appl. Phys. Lett. 56, 2379 (1990)), high pressure liquid phase reduction-oxidation reaction (J. R. Heath, Science 258, 1131 (1992)), etc.

One such advantage is that Group IV semiconductor nanoparticle materials offer the potential of high volume, low-cost processing for the ready deposition of a variety of Group IV nanoparticle inks on a range of substrate materials. After printing, a suitable fabrication method of a Group IV semiconductor device, such as a range of optoelectric devices, including photovoltaic devices must be selected that is compatible with the overall goal of high volume processing.

For example, a solar cell converts solar energy directly to DC (direct current) electric energy. Generally configured as a photodiode, a solar cell permits light to penetrate into the vicinity of metal contacts such that a generated charge carrier (electrons or holes (a lack of electrons)) may be extracted as current. And like most other diodes, photodiodes are formed by combining p-type and n-type semiconductors to form a junction. After the addition of passivation and anti-reflection coatings, a layer acting as back surface field and metal contacts (fingers and busbar on the emitter, and pads on the back of the absorber) may be added in order to extract generated charge. Emitter dopant concentration, in particular, must be optimized for both carrier collection and for contact with the metal electrodes.

In general, a low concentration of dopant atoms within an emitter region will result in low recombination (thus higher solar cell efficiencies (the percentage of sunlight that is converted to electricity)), but poor electrical contact to metal electrodes. Conversely, a high concentration of dopant atoms will result in high recombination (reducing solar cell efficiency), but low resistance ohmic contacts to metal electrodes. Often, in order to reduce manufacturing costs, a single dopant diffusion is generally used to form an emitter, with a doping concentration selected as a compromise between reducing recombination and improving ohmic contact formation. Consequently, potential solar cell efficiency is reduced.

One solution is the use of a dual-doped or selective emitter. A selective emitter uses a first lightly doped region optimized for low recombination, and a second heavily doped region pattern (of the same dopant type) optimized for low resistance ohmic contact formation. Selective emitters are commonly formed with either multiple diffusion steps in conjunction with diffusion blocking layers, or with the use of multiple dopant sources. Commonly, the principal variation between such regions is a difference in dopant atomic concentration, and there is generally no visible contrast between the highly and lightly doped regions. Consequently, the alignment of a metal contact pattern onto a previously deposited highly doped region pattern is a large technical challenge.

For example, the general lack of a visible contrast makes it difficult to monitor the accuracy of metal contact pattern placement or to detect potential axial and/or angular misalignment.

Likewise, in a back-contact solar cell, a set of counter-doped inter-digitated highly doped patterns with superimposed metal contacts are configured on the back side of the solar cell. In addition, the back surface may also be lightly doped with one of the dopants used in the inter-digitated highly doped patterns to form a BSF (back surface field). As with selective emitters, the visual boundaries between highly doped and lightly doped regions are difficult to determine. Consequently, metal contact pattern alignment for this cell structure is also problematic.

Common alignment methods are substrate edge alignment or alignment to fiducial marks. Fiducial marks (or fiducials) allow a pattern deposition device, usually a screen printer or inkjet printer, to deposit the desired pattern relative to specific coordinates on the solar cell. These fiducial marks are placed in an independent step before patterning, thus requiring extra tools and processing steps. Importantly, tolerance errors at each fiducial alignment step are additive. That is, first the selective emitter pattern is defined relative to the fiducials within a certain tolerance followed by the metal deposition also positioned relative to the fiducials with a different tolerance. To ensure alignment of the metal contacts to the selective emitter these tolerances are added and either the selective emitter pattern is designed larger than the metal pattern to ensure no metal touches the lower doped regions or a degree of misalignment is tolerated. In each case a sacrifice in device efficiency potential is accepted due to higher contact resistance when metal is contacting a lower doped region or due to lower current when the selective emitter pattern is designed with large features to ensure metal only contacts highly doped regions. Tighter alignment tolerances enable higher efficiencies.

In general, the aligned placement of two patterns by means of edge alignment requires that the substrate orientation be kept constant (to minimize errors caused by variations in substrate sizes) between subsequent deposition steps, which may restrict and complicate substrate handling. Furthermore, if different deposition tools are used for subsequent layers, the vision systems generally need to base all calculations on exactly the same locations on a given substrate, which may be unrealistic in high throughput manufacturing (generally over 1500 substrates/hour). Finally, alignment accuracy is low due to substrate geometries being non-ideal and edges poorly defined.

In view of the foregoing, there is a desire to provide methods of aligning a set of patterns on a silicon substrate.

SUMMARY

The invention relates, in one embodiment, to a method of aligning a set of patterns on a substrate, the substrate including a substrate surface. The method includes depositing a set of silicon nanoparticles on the substrate surface, the set of silicon nanoparticles including a set of ligand molecules including a set of carbon atoms, wherein a first set of regions is formed where the nanoparticles are deposited and the remaining portions of the substrate surface define a second set of regions. The method also includes densifying the set of silicon nanoparticles into a thin film wherein a set of silicon-organic zones are formed on the substrate surface, wherein the first set of regions has a first reflectivity value and the second set of regions has a second reflectivity value. The method further includes illuminating the substrate surface with an illumination source, wherein the ratio of the second reflectivity value to the first reflectivity value is greater than about 1.1.

BRIEF DESCRIPTION OF THE DRAWINGS

The present invention is illustrated by way of example, and not by way of limitation, in the figures of the accompanying drawings and in which like reference numerals refer to similar elements and in which:

FIG. 5A shows a simplified diagram of a pyramid-textured silicon solar cell substrate surface as analyzed by AES (Auger Electron Spectroscopy), where a silicon nanoparticle fluid was first deposited, densified, and then (partially) removed, in accordance with the invention;

DETAILED DESCRIPTION

Figure 1:
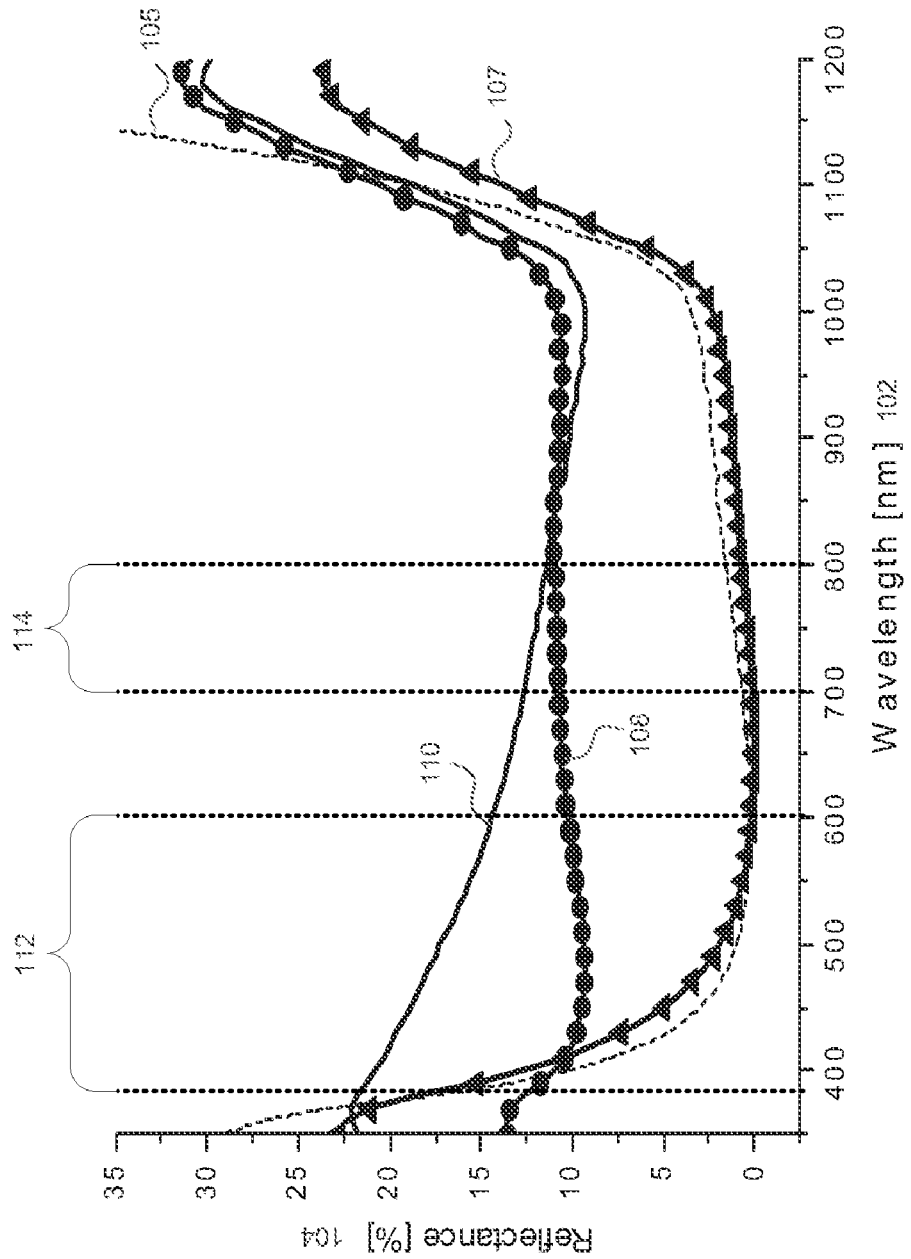
FIG. 1 shows a simplified diagram of a set of diffuse light reflectance curves for a textured crystalline silicon substrate with a nanoparticle thin film coated with an anti-reflection/passivation layer, in accordance with the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In general, an anti-reflective coating, such as silicon nitride, is deposited on a silicon substrate surface in order to maximize the light available to be converted to electrical energy. Creating interference and thus canceling two out-of-phase reflected waves, the thickness of the anti-reflective coating is generally optimized for a particular wavelength and a particular surface reflectivity. In addition, the surface of the silicon substrate may be treated to minimize reflection. Any "roughening" of the surface reduces reflection by increasing the chances of reflected light bouncing back onto the surface, rather than out to the surrounding air.

However, as previously described, the general lack of visual boundaries between highly doped and lightly doped regions in a multi-doped junction make alignment of metal contacts problematic.

In an advantageous manner, by measuring a ratio of reflectance within a specific wavelength region between a first highly doped region formed by the deposition of an organic silicon ink and a second lightly doped diffused region, a subsequent pattern, such as a set of metal contacts, may be deposited in a manner optimized for each individual solar cell substrate. More specifically, a gray scale image may be generated with digital imaging of portions of the solar cell substrate surface with both highly doped and lightly doped areas. This gray value image may then be segmented into common regions which have substantially similar dopant strength.

For example, in one method of forming a highly doped region, a set of silicon nanoparticles is first dispersed in a set of organic solvents, deposited in a pattern, densified to form a thin film, and then (partially) removed prior to the deposition of an anti-reflection coating. It has been observed that deposited silicon nanoparticles, when combined with a standard dopant diffusion process such as exposure to $POCl_3$ gas at high temperature, allow a multi-doped junction to be formed. The solar cell substrate is generally heated up to around 800° C. to 900° C. Nitrogen is then flowed through a bubbler to form a carrier gas for the $POCl_3$. The formed gaseous $POCl_3$, after being mixed with $O_2$, deposits PSG ($P_2O_5$) on the solar cell substrate surface which, in turn, produces phosphorous atoms that diffuse into the crystal Si lattice and $SiO_2$ that forms on the solar cell substrate surface. Subsequently, $SiO_2$ may be selectively etched by aqueous solutions of hydrofluoric acid (HF) and/or ammonium fluoride ($NH_4F$) containing solutions.

One method of depositing the layer of nanoparticles onto the silicon substrate surface is the deposition through the use of a colloidal dispersion (ink) or paste. Generally, colloidal dispersions of Group IV nanoparticles are possible because the interaction of the particle surface with the solvent is strong enough to overcome differences in density, which usually result in a material either sinking or floating in a liquid. That is, smaller nanoparticles disperse more easily than larger nanoparticles. Commonly, particle loadings may be around 3 Wt. %. In contrast, if the particle loading substantially increases above about 10 Wt. %, the colloidal dispersion thickens into a highly viscous ink or paste.

In general, the Group IV nanoparticles are transferred into the colloidal dispersion under a vacuum, or an inert substantially oxygen-free environment. In addition, particle dispersal methods and equipment such as sonication, high shear mixers, and high pressure/high shear homogenizers may be used to facilitate dispersion of the nanoparticles in a selected organic solvent or mixture of solvents. That is, mixtures that contain carbon molecules.

Examples of solvents include alcohols, aldehydes, ketones, carboxylic acids, esters, amines, organosiloxanes, halogenated hydrocarbons, and other hydrocarbon solvents. In addition, the solvents may be mixed in order to optimize physical characteristics such as viscosity, density, polarity, etc.

In addition, in order to better disperse the Group IV nanoparticles in the colloidal dispersion, nanoparticle capping groups may be formed with the addition of organic compounds, such as alcohols, aldehydes, ketones, carboxylic acids, esters, and amines, as well as organosiloxanes. Alternatively, capping groups may be added in-situ by the addition of gases into the plasma chamber. These capping groups may be subsequently removed during the sintering process, or in a lower temperature pre-heat just before the sintering process.

For example, bulky capping agents suitable for use in the preparation of capped Group IV semiconductor nanoparticles include C4-C8 branched alcohols, cyclic alcohols, aldehydes, and ketones, such as tertiary-butanol, isobutanol, cyclohexanol, methyl-cyclohexanol, butanal, isobutanal, cyclohexanone, and oraganosiloxanes, such as methoxy(tris(trimethylsilyl)silane) (MTTMSS), tris(trimethylsilyl)silane (TTMSS), decamethyltetrasiloxane (DMTS), and trimethylmethoxysilane (TMOS).

Once formulated, the colloidal dispersion may be applied to a substrate and subjected to a heat treatment in order to sinter the Group IV nanoparticles into a densified conductive film and consequently enable the diffusion of a dopant into the substrate. Examples of application methods include, but are not limited to, roll coating, slot die coating, gravure printing, flexographic drum printing, screen printing, and inkjet printing methods, etc.

Additionally, various configurations of doped Group IV nanoparticle colloidal dispersions can be formulated by the selective blending of doped, undoped, and/or differently doped Group IV nanoparticles. For example, various formulations of blended Group IV nanoparticle colloidal dispersions can be prepared in which the dopant level for a specific layer of a junction is formulated by blending doped and undoped Group IV nanoparticles to achieve the requirements for that layer. Alternatively, the blended Group IV nanoparticle colloidal dispersions may be used to compensate for substrate defects, such as the passivation of oxygen atoms in order to reduce undesirable energy states.

However, solutions of hydrofluoric acid (HF) and/or ammonium fluoride ($NH_4F$) used to remove $SiO_2$, as previously described, react with Si—O (silicon-oxygen) bonds substantially faster than Si—Si (silicon-silicon) or Si—C (silicon-carbon) bonds, thus oxides are stripped, while silicon and silicon carbide remain. Consequently, a set of thin non-epitaxial continuous or discontinuous zones comprising sets of silicon-organic atomic bonding (silicon and/or silicon carbide) may be formed on the solar cell substrate surface.

While not wishing to be bound by theory, the inventors believe that these thin silicon-organic zones alter the reflectivity of a highly doped region by at least one of two mechanisms. First, in comparison to regions without silicon-organic residue, the addition of a thin organic layer effectively alters the thickness of the anti-reflective coating at that point, which in turn alters the reflected wave interference pattern for aggregate highly doped region surface. Second, the thin silicon-organic residue regions form small superstructure patterns above the substrate surface. An anti-reflective coating, which tends to be deposited conformally on the substrate surface, will also tend to match the superstructure pattern. The superstructure pattern alters the aggregate reflective index of the aggregate highly doped region surface by altering the average steepness of the pyramid angles of the textured surface.

Referring to FIG. 1, a simplified diagram showing a set of diffuse light reflectance curves for a textured crystalline silicon substrate with a nanoparticle thin film coated with an anti-reflection/passivation layer, as may be used in a solar cell, in accordance with the invention. Incident wavelength 102 is shown on the horizontal axis, while measured reflectance percentage 104 is shown on the vertical axis.

Here, crystalline silicon substrates are first pre-cleaned in a sulfuric acid solution. In addition, in order to reduce reflection, a pyramid texture is then added by treating the substrates in a solution of deionized $H_2O$, IPA (isopropanol), and KOH (potassium hydroxide). Next, a silicon nanoparticle thin film pattern is then deposited on the silicon substrate that subsequently defines the highly doped regions. After drying at elevated temperatures in an inert atmosphere, the crystalline silicon substrates are diffused in an atmosphere of $POCl_3$, $N_2$, and $O_2$, as previously described. The residual PSG (phosphosilicate) glass layer is subsequently removed by a BOE (buffered oxide etch) cleaning step. Any portion of the silicon nanoparticle film that is converted to a chemical composition substantially similar to PSG will also be removed. However, silicon-organic regions remain, as previously described.

Generally if the chemical etch period is insufficiently long (less than about 30 seconds) a PSG oxide thickness of between about 300 nm and 1200 nm remains on the solar cell substrate surface. Consequently, although the contrast between highly doped and lightly doped regions may be sufficiently good to ascertain a pattern, the corresponding solar cell efficiency is reduced due to a relatively high reflectivity as well as high series resistance caused by insufficient removal of the PSG layer, which is a non-conductive oxide. In contrast, if the chemical etch period is too long (greater than about 1 hour), the contrast between highly doped and lightly doped regions is poor, increasing the likelihood of metal contact misalignment. However, in an advantageous manner, if the chemical etch period is from about 1 minute to about 10 minutes, silicon-organic containing regions of thickness between 5 nm and 400 nm remain on the silicon substrate surface with sufficient reflective contrast to lightly doped regions.

In a next step, in order to minimize reflection and to optimize surface passivation, an anti-reflection coating and passivation layer of silicon nitride ($Si_3N_4$ and other non-stochiometric ratios of Si and N) is deposited on the silicon substrate in an ambient of silane, ammonia, nitrogen, and optionally hydrogen. Here, the reflective index of the $Si_3N_4$ layer is between about 1.90 and about 2.10, with a thickness of between 40 nm and about 120 nm.

Next, the location of the highly doped regions is determined based on their contrast with respect to lightly doped regions, and the metal contacts are deposited using a deposition device, such as a screen printer. Here, light is projected onto the textured substrate surface and the diffuse reflection is subsequently analyzed. Diffuse reflection is generally the reflection of light from an uneven surface such as a textured silicon substrate. Consequently, the reflected light spreads over the hemisphere surrounding the surface ($2\pi$ steradians).

Curve 110 shows the reflectance of a textured silicon substrate with an oxidized silicon nanoparticle thin film of 1200 nm thickness, as can be used to form a heavily doped region as previously described, coated with a silicon nitride layer of 60 nm thickness. The reflectance at 470 nm is 18.2% and at 540 nm is 15.9%.

Curve 108 shows the reflectance of a textured silicon substrate with an oxidized silicon nanoparticle thin film of 500 nm thickness, as can be used to form a heavily doped region as previously described, coated with a silicon nitride layer of 115 nm thickness. The reflectance at 470 nm is 9.3% and at 540 nm is 9.7%.

Curve 107 shows the reflectance of a textured silicon substrate with a silicon nanoparticle thin film of less than about 30 nm thickness, as can be used to form a heavily doped region as previously described, coated with a silicon nitride layer of 115 nm thickness. The reflectance at 470 nm is 3.4% and at 540 nm is 0.85%.

Curve 105 shows the reflectance of a textured silicon substrate without a silicon nanoparticle thin film, as may be used to form a lightly doped region as previously described, coated with a silicon nitride layer of 115 nm thickness. The reflectance at 470 nm is ~2.7% and at 540 nm is ~0.61%.

As can be seen, for a first wavelength range 112 between 375 nm and 600 nm, and a second wavelength range 114 between 700 nm and 800 nm, there are sharp differences in reflectance. For example, the reflectance of curve 107 is similar in shape to the reflectance of curve 105, which shows a silicon substrate coated with silicon nitride layer only, but is shifted slightly toward higher wavelengths. While not wishing to be bound by theory, the inventors believe that a similar result would be expected if the silicon nitride layer was slightly thicker or if the angle of the pyramid texturing was steeper.

Figure 2A:
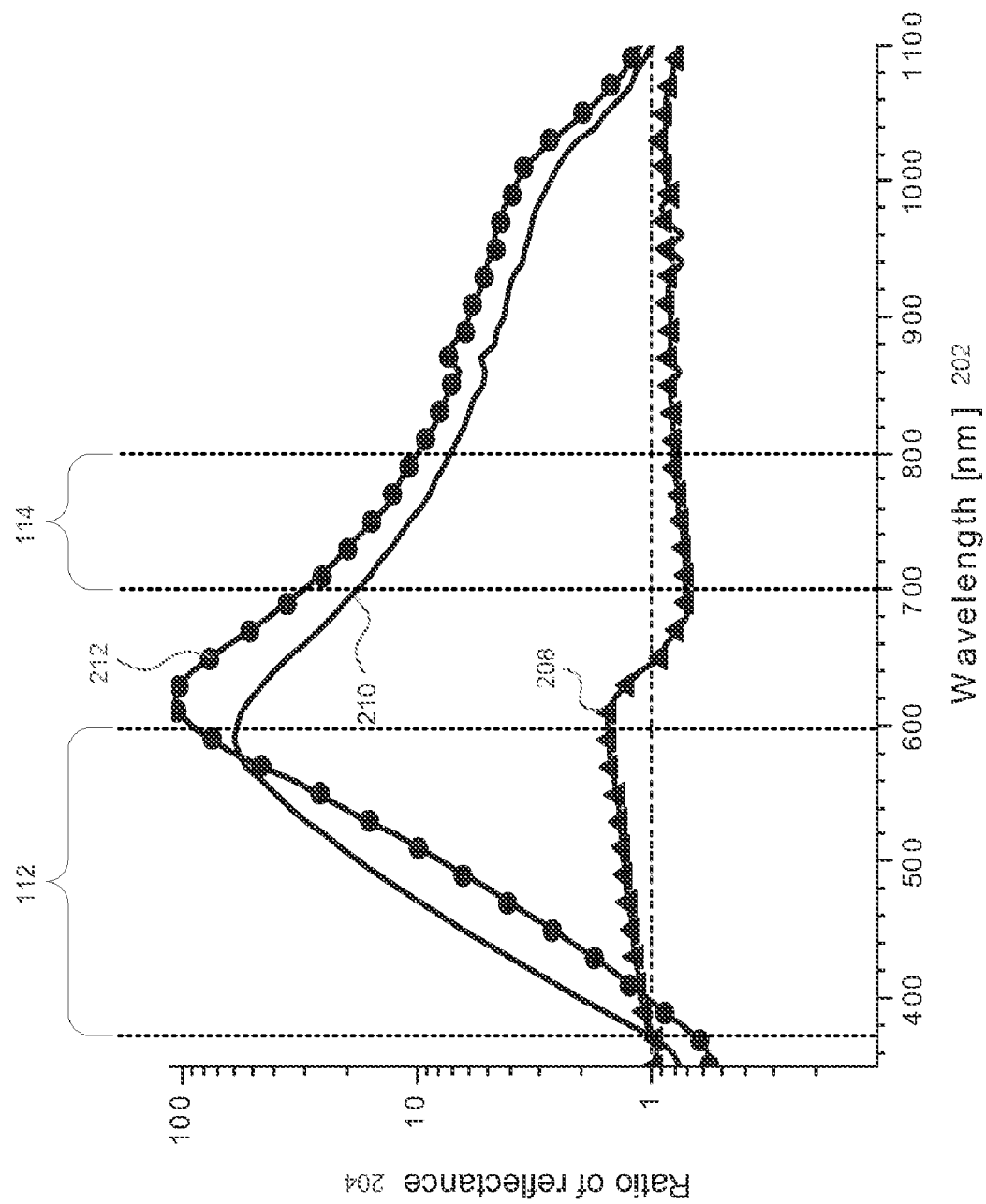
FIG. 2A shows a simplified diagram comparing the ratio of reflectance of highly doped regions to lightly doped regions on a silicon nitride coated textured crystalline silicon substrate, in accordance with the invention.

Referring to FIG. 2A, a simplified diagram comparing the ratio of reflectance of highly doped regions to lightly doped regions on a textured silicon nitride coated crystalline silicon substrate, in accordance with the invention. Incident wavelength 202 is shown on the horizontal axis, while ratio of reflectance curves of highly doped regions to lightly doped regions 204 is shown on the vertical axis.

Curve 212 shows the reflectance ratio of a region with an oxidized silicon nanoparticle thin film of 1200 nm thickness to a region without a silicon nanoparticle thin film on a textured silicon substrate coated with a silicon nitride layer of 60 nm thickness. The ratio of reflectance at 470 nm is about 9.8 and at 540 nm is about 34.2.

Curve 210 shows the reflectance ratio of a region with an oxidized silicon nanoparticle thin film of 500 nm thickness and a region without a silicon nanoparticle thin film on a textured silicon substrate coated with a silicon nitride layer of 115 nm thickness. The ratio of reflectance at 470 nm is 4.0 and at 540 nm is 20.3.

Curve 208 shows the reflectance ratio of a region with an oxidized silicon nanoparticle thin film of less than about 30 nm thickness and a region without a silicon nanoparticle thin film on a textured silicon substrate coated with a silicon nitride layer of 115 nm thickness. The ratio of reflectance at 470 nm is 1.3 and at 540 nm is 1.4.

As shown in FIG. 1, for a first wavelength range 112 between 375 nm and 600 nm, and a second wavelength range 114 between 700 nm and 800 nm, the reflectance ratio of highly doped regions to lightly doped regions is significantly larger than for remaining wavelengths, resulting in higher contrast for wavelength range 112. Wavelengths resulting in a contrast of below 1.3 should be avoided, including wavelengths between 620 nm and 680 nm, which are most commonly used in the production of solar cells.

Figure 2B:
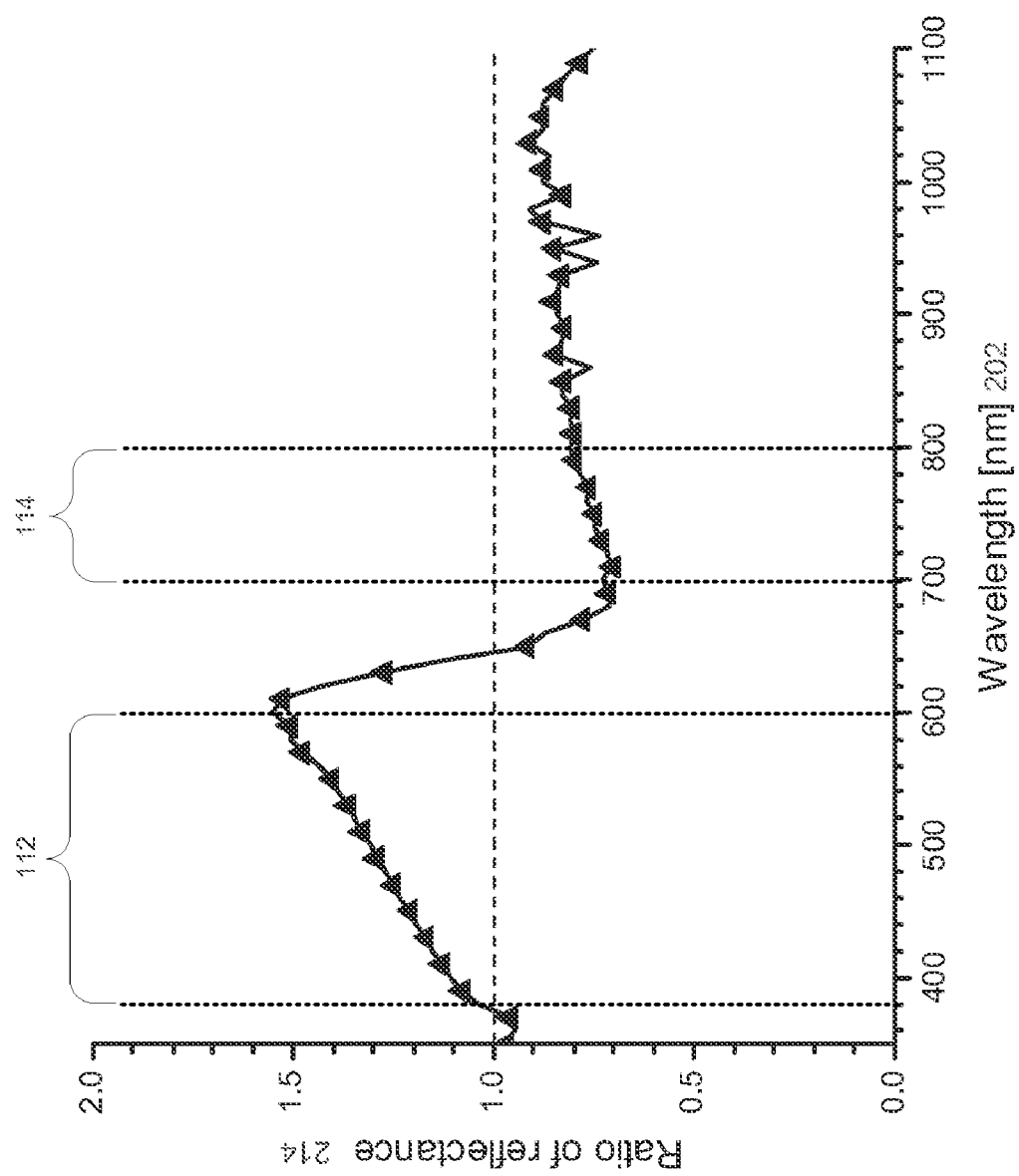
FIG. 2B shows a simplified diagram comparing the ratio of reflectance of highly doped regions to lightly doped regions, in which an organic silicon nanoparticle thin film has first been deposited on a silicon nitride coated textured crystalline silicon substrate to form the highly doped regions, and then (partially) etched away, followed by the deposition of a silicon nitride layer, in accordance with the invention.

Referring to FIG. 2B, a simplified diagram comparing the ratio of reflectance of highly doped regions to lightly doped regions, in which an organic silicon nanoparticle thin film has first been deposited to form the highly doped regions, and then (partially) etched away for 2 minutes as previously described, followed by the deposition of a silicon nitride layer, in accordance with the invention. Incident wavelength 202 is shown on the horizontal axis, while reflectance ratio 214 is shown on the vertical axis. As can be seen, for a first wavelength range 112 between 375 nm and 600 nm, and a second wavelength range 114 between 700 nm and 800 nm, there are sharp differences in reflectivity.

Figure 3:
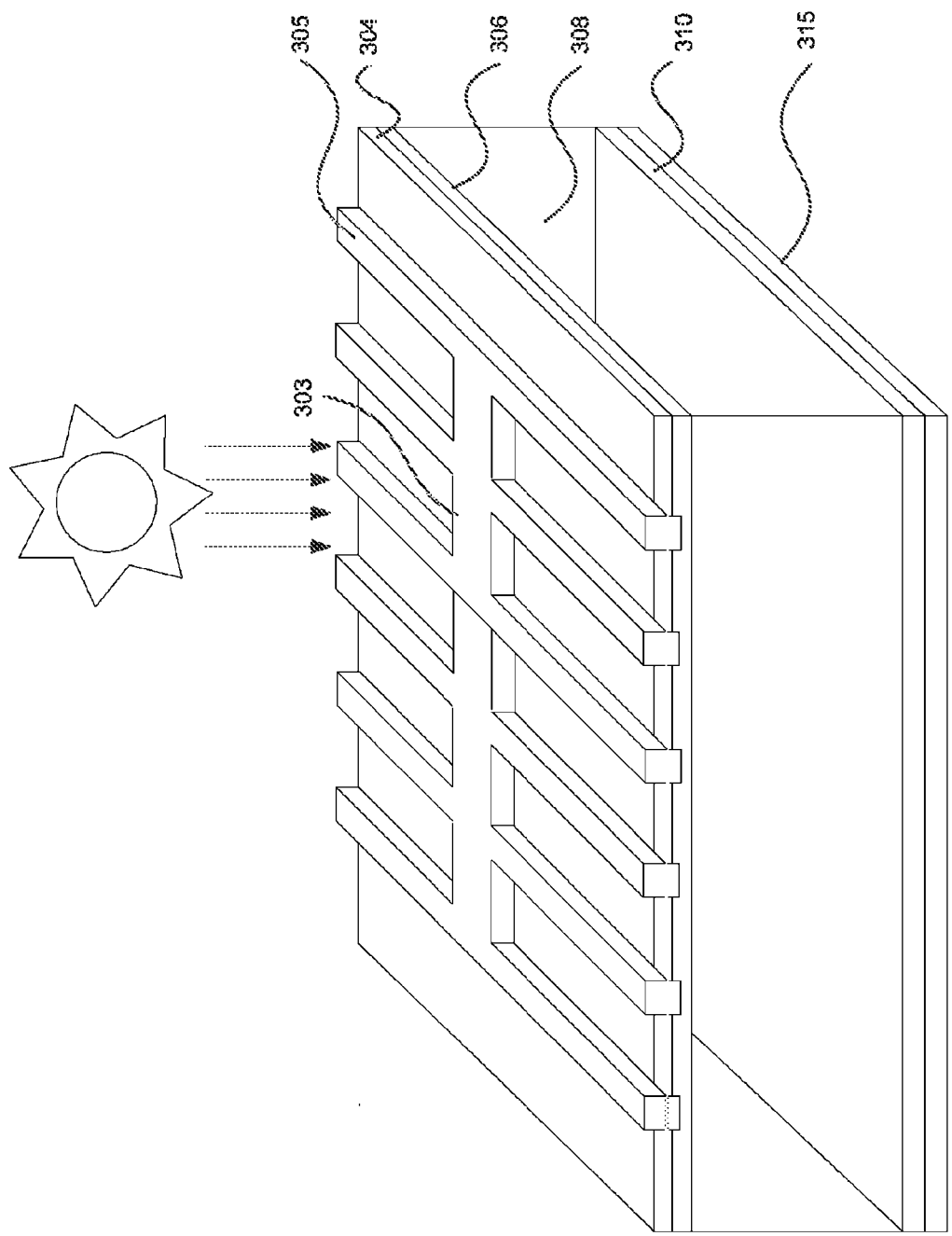
FIG. 3 shows a simplified diagram of a front contact solar cell with a selective emitter and an additional layer acting as back surface field, in accordance with the invention.

Referring now to FIG. 3, a simplified diagram of a front contact solar cell with a selective emitter and an additional layer acting as back surface field (BSF). As previously described, in common solar cells, the visual boundaries between highly doped and lightly doped emitter regions may be difficult to determine, making aligned deposition of a set of metal contacts difficult.

Emitter 306 may be p-type (e.g., boron doped) or n-type (e.g., phosphorous doped) and could be formed by various methods, which include but are not limited to gas phase diffusion (such as e.g. using $POCl_3$ gas as phosphorous source or $BBr_3$ as boron source), solid source diffusion, or inline processes which typically use liquid dopant sources such as e.g. phosphoric acid.

Above the emitter 306 (which is also typically coated with an anti-reflection coating 304) is a front metal contact, comprising a set of fingers 305 (here with a width of about 130 um silver) and a set of busbars 303 (here with a width of about 1500 um silver). Typically made out of silver paste with added glass frit, the front metal contact is optimized to extract the charge carriers (here electrons) created in the silicon substrate 308 when light is absorbed. The front metal contact is also typically configured with a reduced horizontal surface area (thus minimizing losses due to shading, which reduces the generated current), and an increased cross-sectional volume (thus reducing the series resistance of the device, which tends to increase the efficiency of the device).

In general, untreated silicon substrates often reflect more than 30% of incident light. Consequently, in order to reduce this reflected energy and thus directly improve efficiency, the silicon substrate is generally textured and optimized with anti-reflective coatings 304 (e.g., silicon nitride ($Si_3N_4$), etc.). In addition, anti-reflective coating 304 also helps passivate the surface of emitter 306, both reducing the impact of contamination of the substrate bulk from external sources, as well as substantially reducing minority carrier recombination caused by dangling Si bonds or imperfections in the doped substrate 308 surface.

In addition, on the back-side of silicon substrate 308 often is a heavily doped region (of the same type as the substrate) which creates a BSF (back surface field) 310. Minimizing the impact of rear surface recombination, a properly configured BSF tends to repel those minority carriers that are generated closer to the back-side, resulting in higher levels of minority carrier concentrations in the substrate absorber and higher device efficiencies. For example, Al (aluminum) or B (boron) may be added to a p-type substrate to form a BSF layer. In contrast, for an n-type substrate, P (phosphorous) may be added to form a BSF layer. In addition, silver (Ag) or silver/aluminum pads are generally inserted in the back-side in order to facilitate soldering for interconnection into modules.

Figure 4:
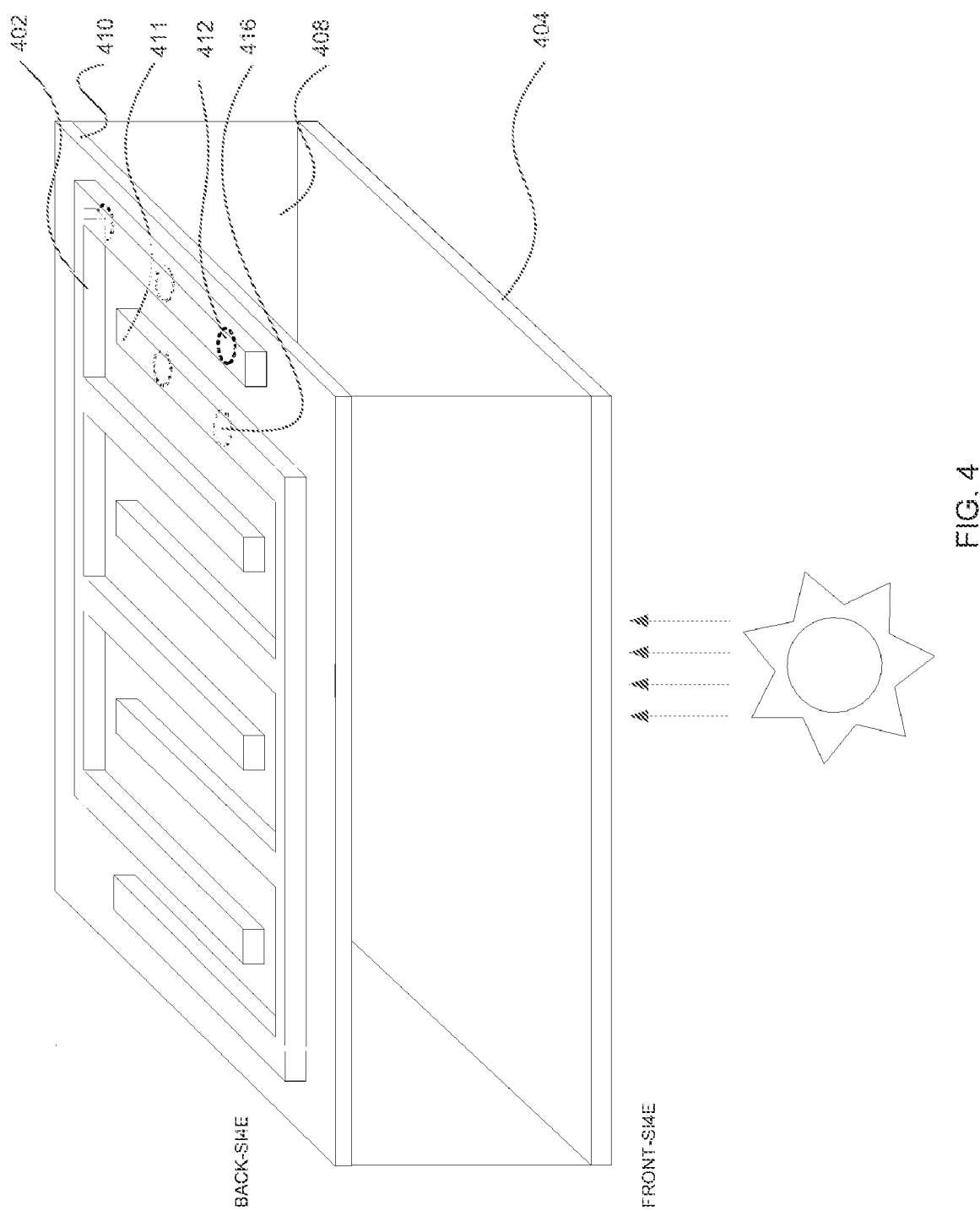
FIG. 4 shows a simplified diagram of a back-contact solar cell, in accordance with the invention.

Referring now to FIG. 4, a simplified diagram of a back-contact solar cell, in accordance with the invention. In a common configuration, a set of p-type (emitter) regions 412 and a set of n-type base contact regions 416 are diffused into an n-type (phosphorous doped) silicon substrate 408. Optionally, a surface passivation layer 410 of silicon nitride or silicon oxide can be deposited on the back side of the surface. In order to extract the charge carriers, an emitter metal contact 402 is deposited over the set of p-type regions 412, and a base metal contact 411 is deposited over the set of n-type regions 416.

In addition, a front-side layer 404 comprised of an FSF (front-surface field) and an anti-reflective coating (as previously described) is also deposited. The FSF is similar in function to a BSF in that it tends to repel minority carriers (here electrons) from the front of the solar cell thus improving passivation quality of the front surface.

EXPERIMENT 1

A crystalline silicon substrate was first pre-cleaned in a sulfuric acid solution and then textured by treating the substrates in a solution of $H_2O$, IPA, and KOH. After cleaning and rinsing steps in SC-2 (a mixture of $H_2O$, HCl (hydrochloric acid) and $H_2O_2$ (hydrogen peroxide)), piranha (a mixture of sulfuric acid ($H_2SO_4$) and $H_2O_2$), BOE, and $H_2O$, respectively, a silicon nanoparticle fluid comprising 4 Wt. % silicon nanoparticle in a set of organic solvents, was deposited on the crystalline silicon substrate. After baking at a temperature of 600° C. in an inert atmosphere for a time period of 3 minutes in order to densify the film and evaporate solvent molecules, the crystalline silicon substrate was exposed to a dopant source in a diffusion furnace with an atmosphere of $POCl_3$, $N_2$, and $O_2$, at a temperature of about 925° C. and for a time period of about 100 minutes. The residual PSG glass layer was subsequently removed by a BOE cleaning step for 5 minutes. During this step, the thickness of the silicon nanoparticle thin film was reduced from about 1200 nm to about 30 nm, and a layer of silicon-organic residue remained behind.

Next, the crystalline silicon substrate was analyzed using Auger Electron Spectroscopy (AES). In general, AES is a technique for determining the composition of the top 5-10 nm of a surface. Incident electrons of energy 3-20 keV tend to cause high binding energy core electrons from atoms in the top surface of a sample (here a silicon substrate) to be ejected. The atom then relaxes via a lower binding energy valence electrons dropping into the hole at the core state. This quantized relaxation energy is transferred to kinetic energy of an ejected electron which can be detected. The kinetic energy of the ejected electron is characteristic of the element from which it was emitted, and can thus be used to identify the element.

Here, although the PSG glass layer and the deposited silicon nanoparticle thin film were substantially removed, a large fraction of carbon atoms were detected (along with residual silicon nanoparticles), sufficient to alter the reflectivity of the highly doped region with respect to the lightly doped regions of the crystalline silicon substrate surface.

Referring now to FIG. 5A, a simplified diagram of a pyramid-textured silicon solar cell substrate surface as analyzed by AES, where a silicon nanoparticle fluid was first deposited, densified, and then (partially) removed as previously described, in accordance with the invention. In general, a textured silicon solar cell substrate surface 502 has pyramid formations of varying width and height. In regions of the pyramid tips 508, about 18 atom % carbon was measured. At the pyramid midpoints 506, about 15 atom % carbon was measured. And at the pyramid valleys 504, about 34 atom % carbon was measured. After removal of ~5 nm of surface material by ion millilng using Ar, there was still approximately 67% of the original carbon atomic concentration remaining, thus demonstrating that the carbon signal was not due to advantageous surface carbon, which could contribute to carbon signal prior to ion milling in AES techniques.

EXPERIMENT 2

A set of crystalline silicon substrates was first pre-cleaned in a sulfuric acid solution and then textured by treating the substrates in a solution of $H_2O$, IPA, and KOH. After cleaning and rinsing steps in SC-2 (a mixture of $H_2O$, HCl (hydrochloric acid) and $H_2O_2$ (hydrogen peroxide)), piranha (a mixture of sulfuric acid ($H_2SO_4$) and $H_2O_2$), BOE, and $H_2O$, respectively, a silicon nanoparticle fluid comprising 4 Wt. % silicon nanoparticle in a set of organic solvents, was deposited on each textured crystalline silicon substrate. After baking at a temperature of 600° C. in an inert atmosphere for a time period of 3 minutes in order to densify the film, the crystalline silicon substrates were exposed to a dopant source in a diffusion furnace with an atmosphere of $POCl_3$, $N_2$, and $O_2$, at a temperature of about 925° C. and for a time period of about 100 minutes. Next, the substrates were subjected to a BOE cleaning step of varying time period. The degree of removal of the residual PSG glass layer and the thickness of the densified silicon nanoparticle film were controlled by varying the period of exposure to BOE from 0 minutes to 60 minutes. Greater etchant exposure corresponds to a thinner densified silicon nanoparticle film and a more thorough removal of the PSG glass layer. In addition, an etchant exposure greater than 10 minutes substantially removes the thinner densified silicon nanoparticle film.

Figure 5B:
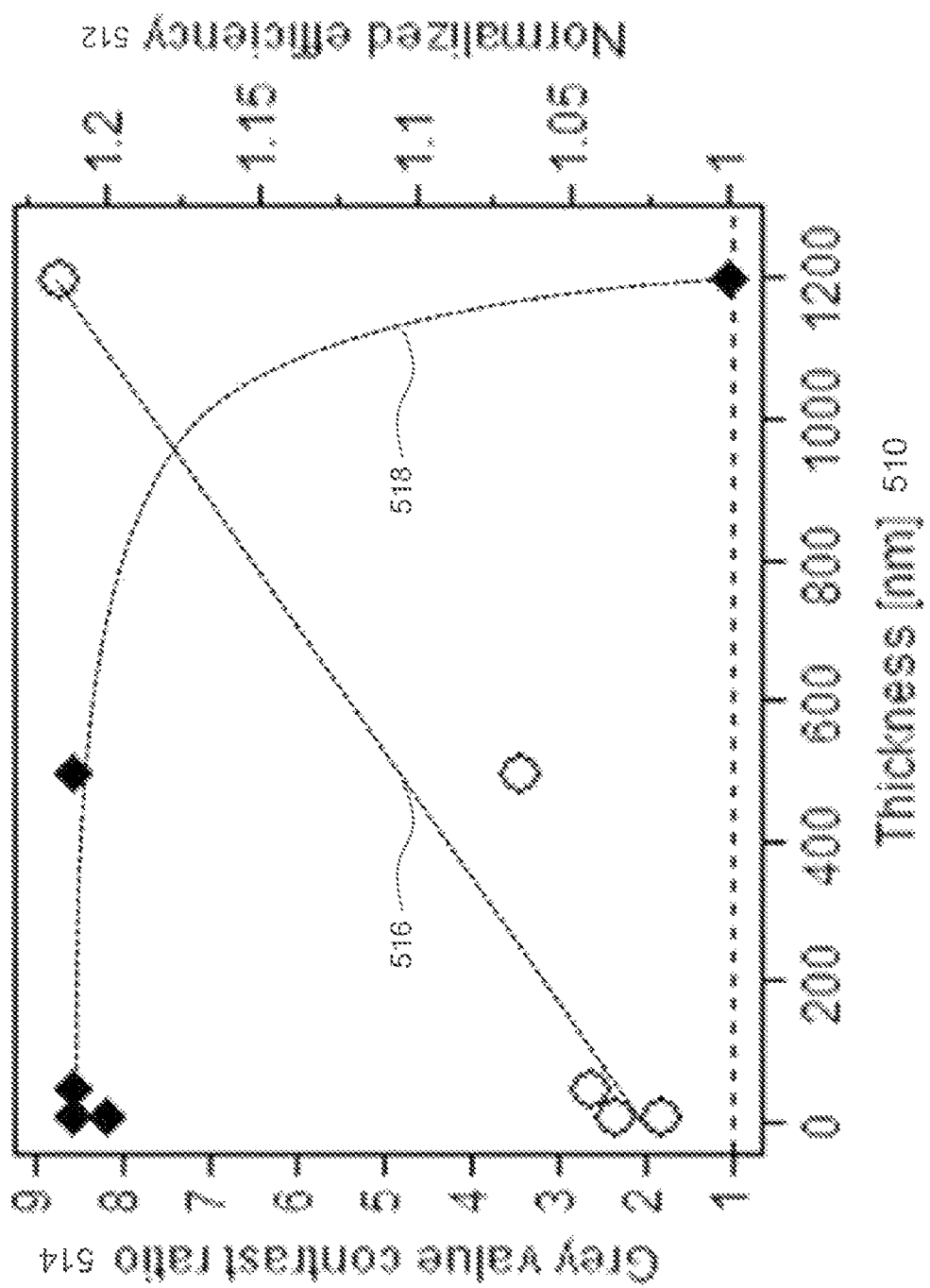
FIG. 5B shows a simplified composite diagram comparing both the gray value contrast ratio and normalized efficiency to a silicon nanoparticle film thickness after deposition, densification, and (partial) removal, in accordance with the invention.

Referring to FIG. 5B, a simplified composite diagram comparing both the gray value contrast ratio obtained for illumination at 470 nm and normalized efficiency to a silicon nanoparticle film thickness after deposition, densification, and (partial) removal, in accordance with the invention. Normalized efficiency refers to a solar cell efficiency value that is normalized to the efficiency of a device with a thickness of a densified silicon nanoparticle film that has not been exposed to an etchant.

In general, gray value contrast ratio is quantified by the ratio of gray scale value of a diffuse light sensor pixel of interest to that of a background pixel. The gray value is generally directly related to the number of photons with appropriate wavelength arriving on a sensor in given unit time. Areas on the solar cell substrate surface with higher reflectivity for a given configuration relative to the diffuse light sensor (i.e. incidence angle, illumination, light wavelength) will be higher on a gray scale. Demarcation between areas with high and low reflectivity (contrast) are best defined when the difference is greatest.

Thickness 510 in nm is shown on the horizontal axis, gray value contrast ratio 514 of gray values of highly doped regions to lightly doped regions obtained for illumination at 470 nm is shown on the left vertical axis, while normalized cell efficiency (power out vs. power in) 512 is shown on the right vertical axis. Curve 516 compares gray value contrast ratio to thickness, while curve 518 compares normalized efficiency to thickness of the densified silicon nanoparticle film. As can be seen, as the thickness decreases from about 1200 nm to about 10 nm, normalized efficiency increases (because of the ability to form a better ohmic contact with a metal contact), while the gray value contrast ratio of highly doped regions to lightly doped regions decreases (corresponding to a thinner silicon organic film residue, as previously discussed).

Referring now to FIG. 6, a simplified diagram of an apparatus for superimposing a set of metal contacts on a set of highly doped regions on a crystalline solar cell substrate in accordance with the invention.

Initially, a solar cell substrate 604 with a set of highly doped regions, such as for a selective emitter or a back-contact solar cell, is positioned on a substrate intake transport apparatus 603 (e.g., conveyor belt, etc.). Solar cell substrate 604 is then positioned in pattern detection apparatus 606 in order to determine the axial (x and y) and angular position (theta) of known landmarks within the pattern of the highly doped regions. For example, if the set of highly doped regions is patterned as a set of busbars and fingers, the set of known landmarks may be specific intersections of a busbar to a finger at well defined locations. Alternatively, unique landmarks can be added to the pattern of highly doped regions. These landmarks may be used as unique features within the patterns of highly doped regions for the image recognition step.

Once determined, the locations of the landmarks within the set of highly doped regions are transmitted to metal deposition apparatus 610 (such as a screen printer which may include squeegee 612). After solar cell substrate 604 is positioned in metal deposition apparatus 610 (here via turntable 608), the printing screen of metal deposition apparatus 610 is adjusted axially and angularly in order to align the set of metal contacts to be deposited onto the set of highly doped regions. After deposition of the metal contacts onto the set of highly doped regions using squeegee 612, the solar cell substrate with the set of metal contacts [not shown] is then positioned on substrate outtake transport apparatus 611, where it may be transported for additional processing.

In one configuration, substrate 604 is placed in the pattern detection apparatus 606 of an Applied Materials Baccini screen printer tool with a vision system based on three high-resolution cameras and image recognition software. Initially, the image recognition software is instructed to look for a specific set of patterns or landmarks. Here, the image recognition software vision libraries are based on Cognex Vision Pro and may include several algorithms such as 'Pattern Matching', 'PatMax', and 'PatCAD'. The first two algorithms record an image of a model pattern of best possible quality and process it into characteristic geometric features (i.e. lines, circles) that are used for image recognition, whereas the last algorithm allows loading a design generated with CAD software, which represents the model pattern in an ideal case.

A CAD pattern algorithm in particular may be advantageous because it allows the pattern recognition software to search for a well-defined CAD pattern rather than a manually defined search area, which enhances the placement accuracy and resilience to contrast and pattern variations. In addition, for the calculation of the required screen rotation, the center coordinates of the respective search areas with respect to the center of the entire pattern generally need to be accurately known. In an advantageous manner, these coordinates tend to be well defined for the CAD pattern, whereas with the remaining algorithms and manual selection of a search area the center coordinates have to be estimated causing an additional placement error.

In general, in order to be identified, the set of patterns should be chosen such that it is located within the field of view of each camera used for the vision system. Pattern recognition generally requires the availability of unique features within the pattern, which define distinct locations in x and y direction. These features can either be contained in the first pattern itself, or may be added as unique alignment features without impacting the device performance. Next, in an advantageous manner, the solar cell substrate is illuminated at a wavelength preferably between about 375 nm and about 600 nm and between 700 nm and 800 nm, and most preferably at 470 nm or 540 nm.

The inventors believe that these wavelength ranges are optimized for maximum contrast of the highly doped regions with respect to the lightly doped regions of the crystalline solar cell substrate (background). Achievable gray value contrast and reflectance ratios are higher for 540 nm (see FIG. 7), but in common applications, substrate texturing and anti-reflection coatings are optimized such that absolute reflectance is minimal close to this wavelength. Therefore, the while 540 nm has superior contrast ratio compared to 470 nm the, 470 nm has superior signal-to-noise ratio. The optimum configuration balances these factors in an advantageous manner depending on the absolute reflectance of the substrate and illumination level. Furthermore, the efficiency of green LEDs is commonly lower than of blue LEDs, making 470 nm a favorable illumination wavelength. In general, wavelengths between 700 and 800 nm yield considerable contrast as well, but even though the common CCD (charge-coupled device) cameras have considerable sensitivity in this wavelength range, the peak response is usually between 500 and 550 nm making this wavelength region less advantageous.

In addition, the angle of the illumination source may be adjusted such that it is optimized for maximum contrast when observed with a diffuse light sensor. In this configuration, vertical orientation of the illumination source relative to the lens axis of the diffuse light sensor yields best results, but in other configurations (depending on substrate surface, diffusion properties, etc), the angle can be varied within 90 degrees with respect to the substrate surface.

The angle of the diffused light sensor may be adjusted such that it is optimized to obtain maximum contrast of the highly doped region with respect to the lightly doped regions on the solar cell substrate. In this configuration, a substantially vertical orientation of the light sensor with respect to substrate surface yields best results, but in other configurations (depending on substrate surface, diffusion properties, etc), angle can be varied to 90 degrees with respect to the substrate surface.

In addition, the intensity of the illumination source may be adjusted to obtain sufficient contrast. In this configuration, 4 linear bars of blue LEDs of 470 nm have been used, with 4×96 LEDs in each bar and an adjustable total light intensity of 15.5 W maximum. Similar linear bars of white LEDs covered with a green color filter have been used to produce illumination at 540 nm. In an alternate configuration, ring-shaped illumination sources around each camera lens and coaxial illumination may be used as functional alternatives, since both maintain the incident and reflected light paths nearly parallel to the substrate plane normal.

In general, the diffuse light sensors are selected such that they are sensitive to the wavelengths of the appropriate illumination source. In this configuration, video cameras are used with appropriate CCD chips. The resolution needs to be sufficient to resolve all relevant features of the pattern used for the alignment. The field of view needs to be large enough to image all relevant features of the pattern used for the alignment. In this configuration, SONY XCD-SX90 CCD cameras were used, together with Tamron lenses CCTV 21HA (with a focal length of 50 mm). The resolution was 1280×960 pixels. The field of view at approximately 155 mm operating distance was about 20 mm×15 mm. Band pass filters optimized to the wavelength range of the illumination source may be used to filter out background light and obtain better contrast.

Typically, the requirements for the placement accuracy of the substrate containing the pattern are that the areas of interest are within the field of view of the cameras. In our case this corresponds to an area of 20 mm×15 mm. The sizes of the features that are used for image recognition are 5 mm×5 mm. Therefore, the substrate can be placed within +/−7.5 mm in both directions.

In general, vision system software has parameters needed in order to detect the model pattern of interest in the recorded image. For example, exposure, brightness, contrast may need to be adjusted in order to obtain maximum contrast. In general, the values depend on the given illumination source and position, camera type and position, substrate surface, and pattern composition, etc. The values should further be adjusted such that the gray scale contrast ratio is large enough to allow for pattern recognition. In this configuration, successful pattern recognition requires this ratio to be larger than 1.3. Values as low as 1.1 may be sufficient to allow for successful pattern recognition.

In general, vision software searches for a match of the model pattern to the detected image. The geometric constraints of the model can be adjusted to allow for asymmetric or symmetric scaling. In this example, the scaling was allowed to be between 0.8 and 1.6, and symmetric and asymmetric scaling was used, depending on the pattern fidelity of the printed pattern.

In addition, gain should be adjusted according to the image quality of the recorded image. Grain generally defines the number of pixels over which the transition between two regions is assumed to occur. In addition, low contrast substrates require high exposure and contrast settings in the software, leading to grainier images. Grain adjustments can enable pattern recognition for such cases. The settings in our case range from 1 to 12.

Angle adjustments may also need to be made in order to exclude pattern recognition for rotations in excess of a certain angle. In this case, patterns within +/−10 degrees were searched.

In the next step, the screen translation/rotation and alignment with respect to the previously deposited pattern is calculated. In general, for pattern alignment, although at least two coordinates need to be defined for a calculation of screen translation and rotation, the addition of a third coordinate may improve the accuracy of the alignment process. In this configuration, the alignment was based on three coordinates. The coordinates used for the pattern alignment calculations are defined as the geometric center of the model pattern, either determined by a model image, or by a CAD drawing.

The substrate may then be inspected with an optical vision tool (such as an optical microscope or Micro-Vu Vertex 320 tool as described below), and the respective coordinates of the landmark features as discussed above may be determined, and then transmitted to or entered into the software as nominal positions. In general, the vision software compares these nominal locations with the ones determined in the image recognition process and calculates a translation and rotation for the screen to guarantee alignment of the two patterns.

In this example, a test sample was printed and inspected using the same vision tool. Any remaining axial and angular offsets that depend on mechanical parameters (screen location, squeegee location, etc.) may be corrected in the vision software. Once determined, the location of the known landmarks within the set of highly doped regions was transmitted to metal deposition apparatus 610, which included squeegee 612 as previously described. After adjusting the setup and parameters for the image recognition and pattern alignment process, a layer of silver containing glass frit to fire through the $Si_3N_4$ layer was printed on top of the previously deposited layer defining the highly doped region. Consequently, successive samples may be printed within the achievable accuracy of the vision system. Here, the sample-to-sample accuracy has been shown to be better than +/−16 µm.

After a first drying step to remove excessive solvents, the backside of the cells was printed with an Ag/Al contact layer, and after another drying step, a BSF layer comprised of aluminum was printed. Subsequently, the solar cell substrate 604 was processed in a third drying step, followed by the contact formation which may be done by co-firing the cells in a belt furnace.

Next, the crystalline solar cell substrate was processed by a solar cell substrate edge isolation apparatus, usually including a laser whereby a groove is continuously scribed completely through the emitter layer.

Optionally, in order to check the quality of the actual metal deposition, the alignment of the deposited metal contact with respect to the highly doped region pattern may be determined. In general, the deposition mechanism of metal deposition apparatus 610 (here squeegee 612) must be physically aligned and positioned to an initial known position and angle. The metal deposition apparatus 610 in turn offsets from this position and angle with pattern information from the vision software in order to actually deposit the metal on the highly doped region. However, the actual position and angle tend to change due to manufacturing conditions such as wear and temperature fluctuations, which in turn causes the position of the resulting deposited pattern to drift. In general, it is desirable to analyze pattern alignment during manufacturing at a rate at least twice that of the periodicity of machine offset variation within ±5 µm.

In an advantageous manner, using a vision apparatus, such as a Micro-Vu Vertex, the actual drift between the deposited metal and the highly doped region pattern may be automatically determined by varying the illumination angle and intensity of a light source. For example, the Micro-Vu Vertex projects an illumination source optimized to yield maximum contrast. In this configuration, the standard red light source of the vision system was replaced by white LEDs, which tend to have a strong contribution in the required wavelengths range below 600 nm, specifically 470 nm and 540 nm.

Here, the substrate surface is first illuminated with a white illumination source with an incident power of about 50 $mW/cm^2$ to about 400 $mW/cm^2$ and an incident angle of 2-20 degrees from the substrate surface normal vector in order to detect known landmarks of the highly doped regions. It has also been determined experimentally that for a automated vision tool with variable angle ring illumination, detection of the highly doped regions can be improved with the simultaneous illumination of an additional light source at an incident angle of 60-80° from the substrate surface normal vector. Next, the substrate surface is illuminated with a light source with an incident power of about 1 mW/cm$^2$ to about 20 mW/cm$^2$ and an incident angle of 0-85 degrees from the substrate surface normal vector in order to detect known landmarks of the deposited metal. After recognition of the known landmarks from both the selective emitter pattern and metal contact, the actual axial and angular position between the selective emitter and the metal contact patterns may be determined.

Figure 6A:
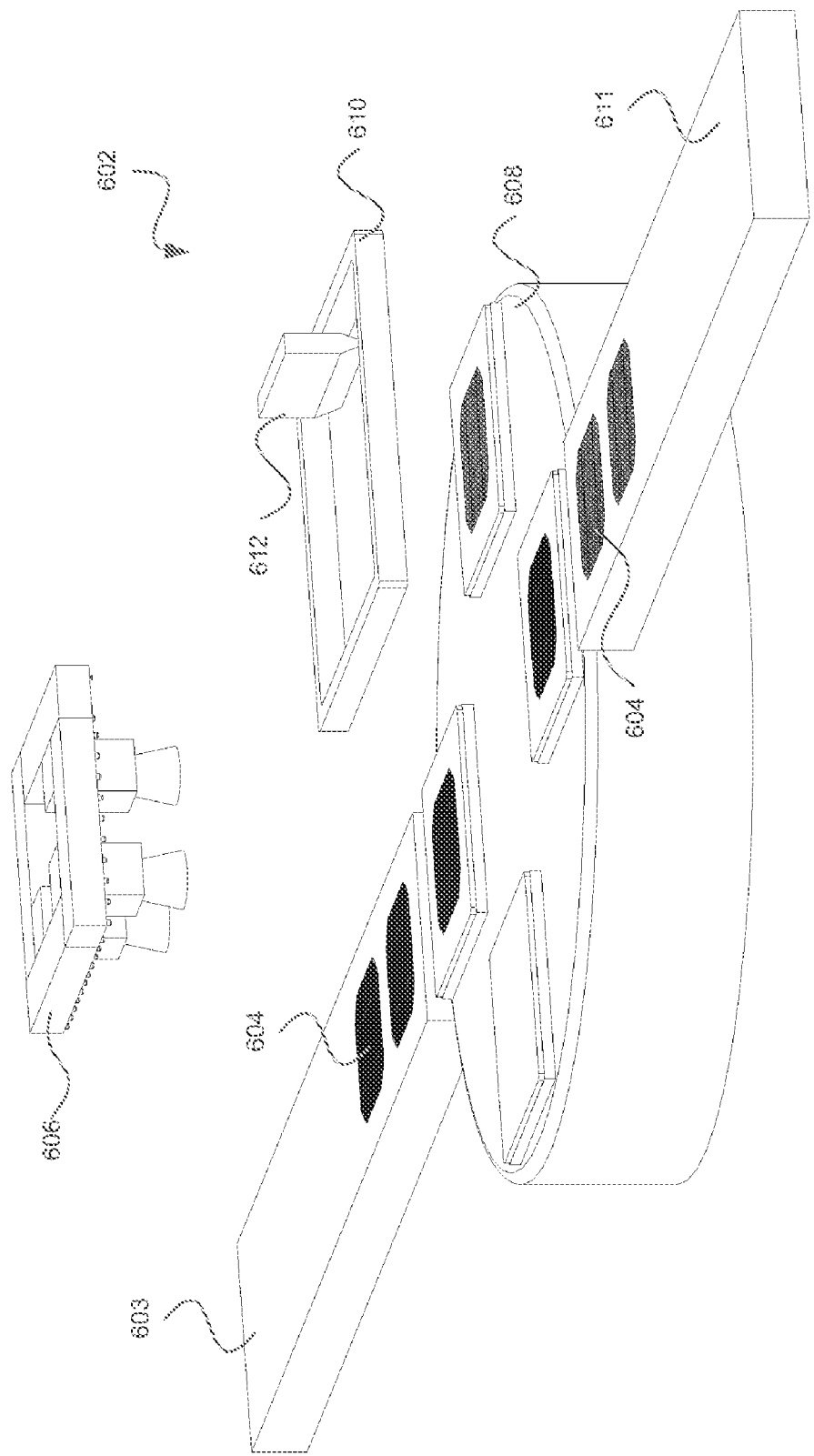
FIGS. 6A and 6B show a simplified set of diagrams of an apparatus for superimposing a set of metal contacts on a set of highly doped regions on a crystalline solar cell substrate, in accordance with the invention.
Figure 6B:
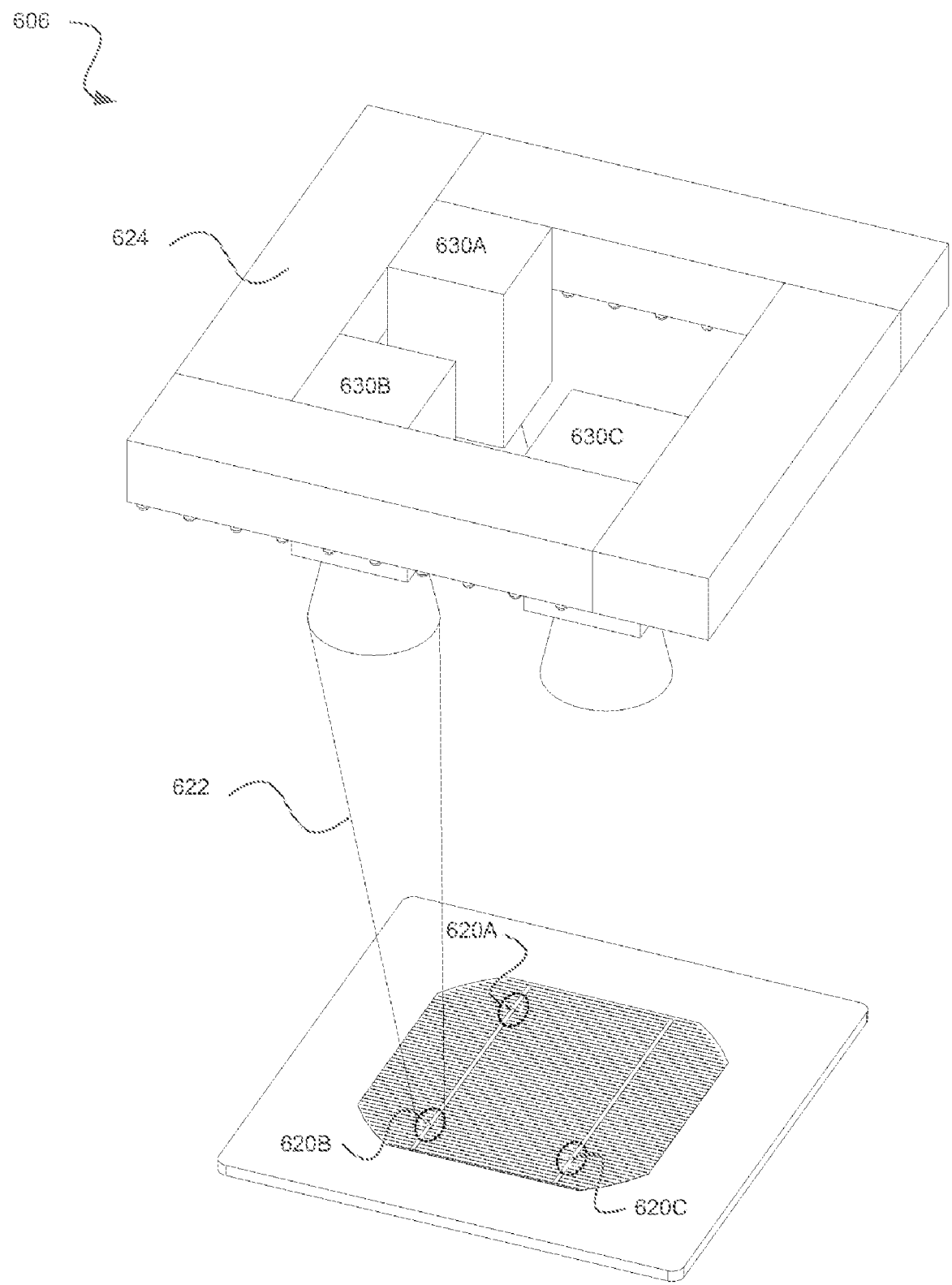

Referring now to FIG. 6B, a simplified diagram of one configuration of the pattern detection apparatus of FIG. 6A, in accordance with the invention. Here, a set of LED (light emitting diodes) banks 624 was positioned around a set of diffuse light detectors (e.g., cameras, etc.) 630A-C. As solar cell substrate 604 was positioned under the set of LED banks 624, and light with a wavelength between about 375 nm and about 600 nm was projected onto the substrate surface. As previously described, the uneven surface solar cell substrate 604 causes the reflection 622 to be diffuse. Each detector of the set of diffuse light detectors 630A-C was positioned with respect to a corresponding known landmark 620A-C as previously described. In this configuration, each bank of the set of LED banks 624 had 96 blue LEDs with an illumination wavelength of 470 nm and a maximum intensity of 15.5 W.

In addition, the system was comprised of diffuse light detectors F30A-C SONY XCD-SX90 CCD cameras, with Tamron lenses CCTV 21HA (focal length is 50 mm). Each camera was configured with a resolution of about 1280×960 pixels and a field of view of about 20 mm×15 mm and operating distance of about 155 mm. Furthermore, optical filters may be used to optimize the contrast of the set of highly doped regions to lightly doped regions. In some cases, it is advantageous to use long pass, short pass, or band pass filters. In general, these filters allow wavelengths of the illumination source to pass, while wavelengths attributed to background light to be filtered. Here, 470 nm band pass filters were used for 470 nm illumination.

Figure 7:
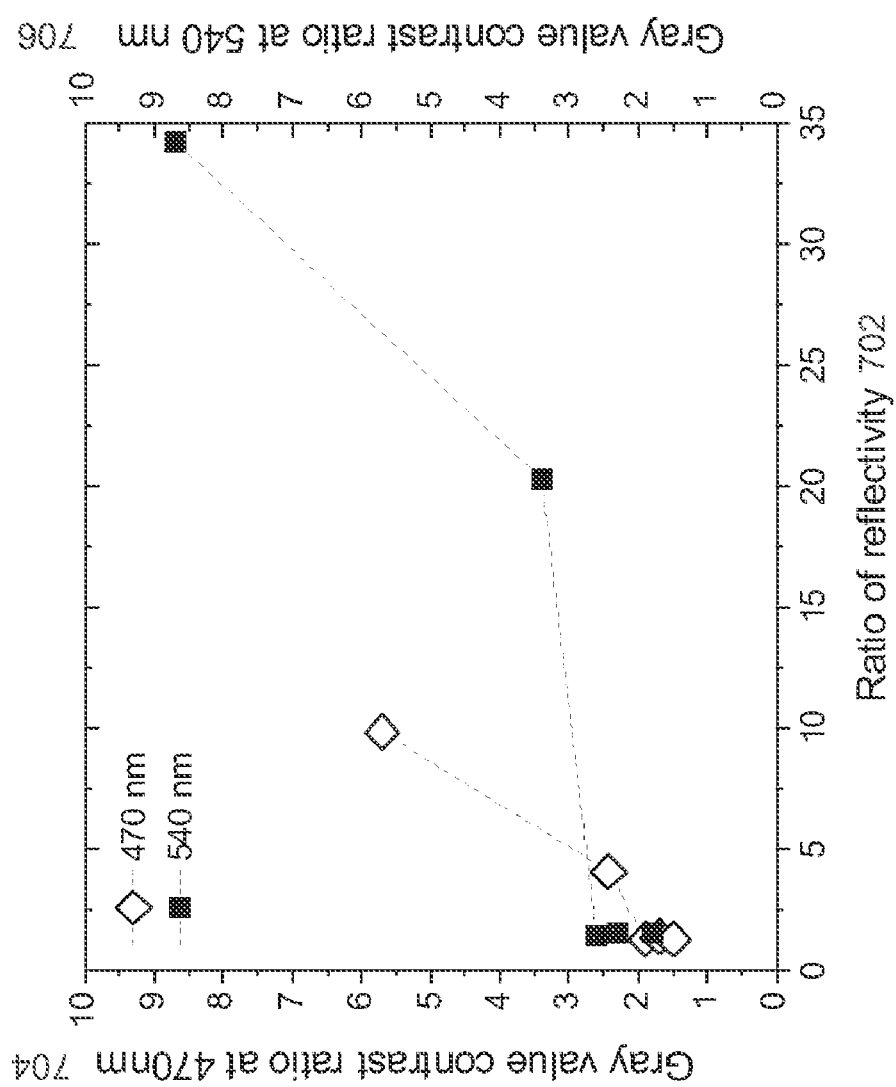
FIG. 7 shows a simplified diagram comparing ratio of reflectance at 470 nm to gray value contrast, in accordance with the invention.

Referring to FIG. 7, a simplified diagram comparing ratio of reflectance to gray value contrast for illumination at 470 nm and 540 nm, respectively, in accordance with the invention. Ratio of reflectance 702 is shown on the horizontal axis, gray value contrast ratio at 470 nm 704 is shown on the left vertical axis, and gray value contrast ratio at 540 nm 706 is shown on the right vertical axis. As can be seen, gray value contrast between two proximate pixels on a measured diffused light image is directly correlated to the observed ratio of reflectance between those two pixels.

Figure 8:
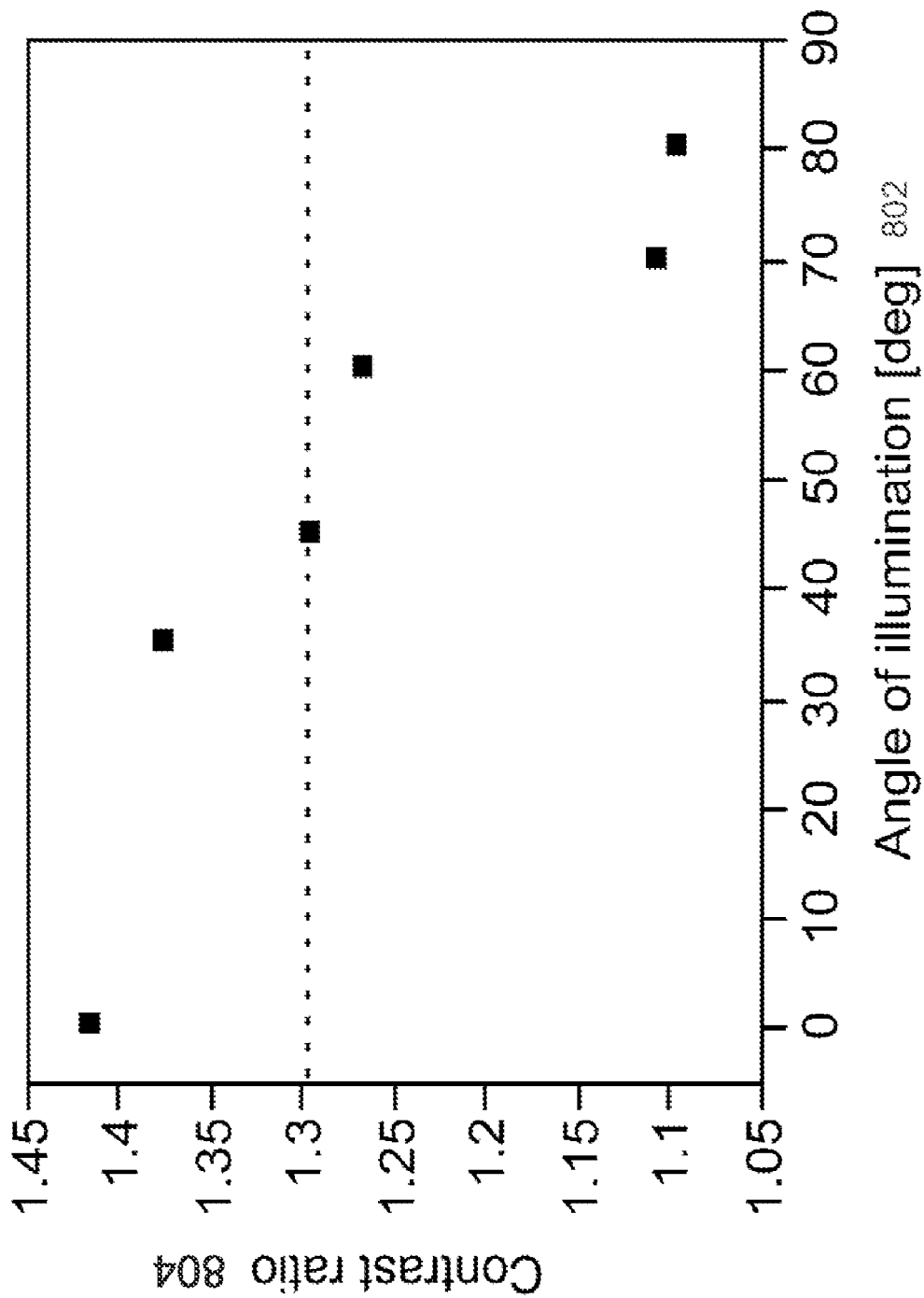
FIG. 8 shows a simplified diagram comparing angle of illumination at 470 nm to gray value contrast, in accordance with the invention.

Referring to FIG. 8, a simplified diagram comparing angle of illumination to gray value contrast, in accordance with the invention. In general, the angle of illumination is relative to the lens axis of the diffuse light sensor. Angle of illumination in degrees 802 is shown on the horizontal axis, while gray value contrast ratio 804 is shown on the vertical axis. In general, a substantially high gray scale contrast ratio (1.42) is observed when the angle of illumination is about 0.0 degrees.

While not wishing to be bound by theory, the inventors believe that light is principally scattered in a normal direction in those highly doped regions with the silicon-organic zones (especially in valleys of the pyramid textured surface), whereas in lightly doped regions there is no dominant light scattering direction. Consequently, a maximum contrast may be measured when the angle of illumination is about 0.0.

Figure 9:
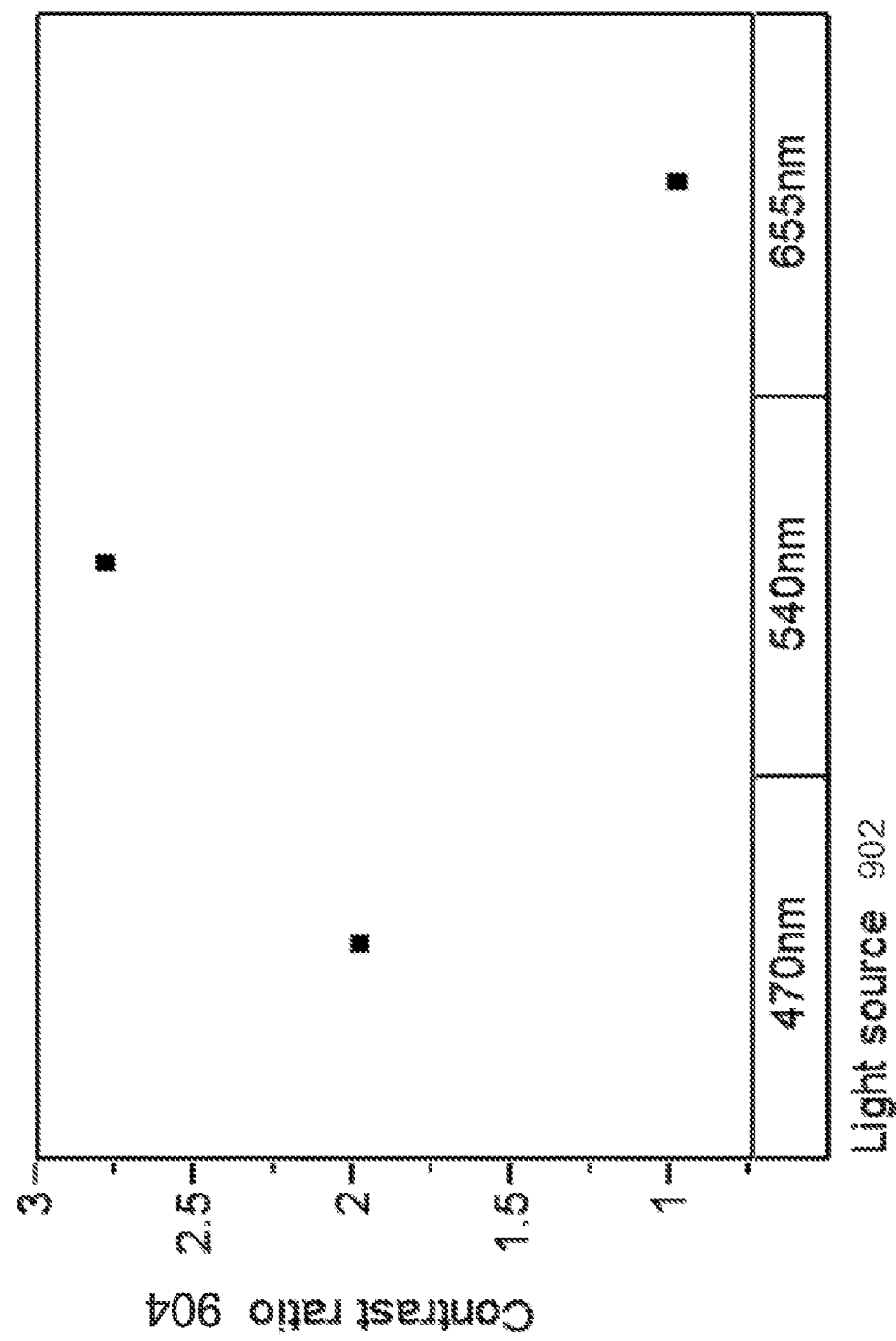
FIG. 9 shows a simplified diagram comparing illumination wavelength to contrast, in accordance with the invention.

Referring now to FIG. 9, a simplified diagram comparing illumination wavelength to contrast, in accordance with the invention. Light source wavelength 902 is shown on the horizontal axis, while gray value contrast ratio 904 is shown on the vertical axis. As can be seen, a wavelength of both 470 nm and 540 nm produce sufficient contrast between the highly doped and lightly doped regions on the silicon substrate surface, whereas a wavelength of about 655 nm does not show sufficient contrast. The latter wavelength is in a spectral region which is most commonly used in the production of solar cells.

The inventions illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed.

Thus, it should be understood that although the present invention has been specifically disclosed by preferred embodiments and optional features, modification, improvement and variation of the inventions herein disclosed may be resorted to by those skilled in the art, and that such modifications, improvements and variations are considered to be within the scope of this invention. The materials, methods, and examples provided here are representative of preferred embodiments, are exemplary, and are not intended as limitations on the scope of the invention. For example, the silicon substrate may include crystalline substrates and multi-crystalline substrates.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above.

All publications, patent applications, issued patents, and other documents referred to in this specification are herein incorporated by reference as if each individual publication, patent application, issued patent, or other document were specifically and individually indicated to be incorporated by reference in its entirety. Definitions that are contained in text incorporated by reference are excluded to the extent that they contradict definitions in this disclosure.

For the purposes of this disclosure and unless otherwise specified, "a" or "an" means "one or more." All patents, applications, references and publications cited herein are incorporated by reference in their entirety to the same extent as if they were individually incorporated by reference. In addition, the word set refers to a collection of one or more items or objects.

Advantages of the invention include methods of aligning a set of patterns on a silicon substrate. Additional advantages include the production of solar cells with enhanced efficiency and lower contact resistance.

Having disclosed exemplary embodiments and the best mode, modifications and variations may be made to the disclosed embodiments while remaining within the subject and spirit of the invention as defined by the following claims.

What is claimed is:

1. A method of aligning a set of patterns on a substrate, the substrate comprising a substrate surface, comprising:
    depositing a set of silicon nanoparticles on the substrate surface, the set of silicon nanoparticles comprising a set of ligand molecules comprising a set of carbon atoms, wherein a first set of regions is formed where the nanoparticles are deposited and a second set of regions is formed where the nanoparticles are not deposited;
    densifying the set of silicon nanoparticles into a thin film wherein a set of silicon-organic zones are formed on the substrate surface, wherein the first set of regions has a first reflectivity value and the second set of regions has a second reflectivity value; and
    illuminating the substrate surface with an illumination source, wherein the ratio of the second reflectivity value to the first reflectivity value is greater than about 1.1.

2. The method of claim 1, wherein the illumination source has a wavelength between about 375 nm and about 600 nm or between about 700 nm and about 800 nm.

3. The method of claim 1, wherein the illumination source has a wavelength of about 470 nm or about 540 nm.

4. The method of claim 1, wherein the silicon-organic zones comprise one of a second set of silicon atoms and a set of silicon carbide atoms.

5. The method of claim 1, further comprising measuring a reflected contrast between the first set of regions and the second set of regions after illuminating the substrate surface.

6. The method of claim 5, further comprising the step of depositing a fluid on the first set of regions after the step of measuring the reflected contrast between the first set of regions and the second set of regions.

7. The method of claim 6, wherein the fluid is one of a silver paste and an aluminum paste.

8. The method of claim 7, further comprising
    illuminating the substrate surface with a first white illumination source with a first incident power of about 50 mW/cm$^2$ to about 400 mW/cm$^2$ and at a first incident angle of about 2 degrees to about 20 degrees from a substrate surface normal vector, and
    illuminating the substrate surface with a second white illumination source with a second incident power of about 1 mW/cm$^2$ and at an second incident angle of about 0 degrees to about 85 degrees from the substrate surface normal vector,
    after illuminating the substrate surface with the illumination source.

9. The method of claim 7, further comprising
    illuminating the substrate surface with a first white illumination source with a first incident power of about 50 mW/cm$^2$ to about 400 mW/cm$^2$ and at a first incident angle of about 2 degrees to about 20 degrees from a substrate surface normal vector, and further illuminating the substrate surface with a second white illumination source with a second incident power of about 50 mW/cm$^2$ to about 400 mW/cm$^2$ and at a second incident angle of about 60 degrees to about 80 degrees from the substrate surface normal vector, and
    illuminating the substrate surface with a third white illumination source with a third incident power of about 1 mW/cm$^2$ and at an incident angle of about 0 degrees to about 85 degrees from the substrate surface normal vector,
    after illuminating the substrate surface with the illumination source.

10. The method of claim 5, wherein the reflected contrast is measured by a diffuse light sensor with a lens axis, wherein the illumination source is substantially parallel to the lens axis.

11. The method of claim 1, further comprising the step of depositing an anti-reflective coating on the substrate surface after densifying the set of silicon nanoparticles into the thin film.

12. The method of claim 1, wherein the substrate surface is one of a front surface and a back surface.

13. The method of claim 1, wherein the nanoparticles are one of doped and intrinsic.

14. The method of claim 1, wherein the nanoparticles are doped with one of boron and phosphorous.

15. The method of claim 1, wherein the first set of regions has a high dopant concentration and the second set of regions has a low dopant concentration.

16. An apparatus for aligning a set of patterns on a substrate, the substrate comprising a substrate surface, comprising:
    means for depositing a set of silicon nanoparticles on the substrate surface, the set of silicon nanoparticles comprising a set of ligand molecules comprising a set of carbon atoms, wherein a first set of regions is formed where the nanoparticles are deposited and a second set of regions is formed where the nanoparticles are not deposited;
    means for densifying the set of silicon nanoparticles into a thin film wherein a set of silicon-organic zones are formed on the substrate surface, wherein the first set of regions has a first reflectivity value and the second set of regions has a second reflectivity value; and
    means for illuminating the substrate surface with a wavelength between about 375 nm and about 600 nm or between about 700 nm and about 800 nm, wherein the ratio of the second reflectivity value to the first reflectivity value is greater than about 1.1.

17. The apparatus of claim 16, further comprising means for measuring a reflected contrast between the first set of regions and the second set of regions.

* * * * *